(12) United States Patent
Zhang et al.

(10) Patent No.: US 10,770,519 B2
(45) Date of Patent: Sep. 8, 2020

(54) ORGANIC LIGHT-EMITTING DIODE DISPLAY PANEL AND ORGANIC LIGHT-EMITTING DIODE DISPLAY APPARATUS

(71) Applicant: Wuhan China Star Optoelectronics Semiconductor Display Technology Co., Ltd., Wuhan, Hubei (CN)

(72) Inventors: Feng Zhang, Guangdong (CN); Shou-Cheng Wang, Guangdong (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/219,895

(22) Filed: Dec. 13, 2018

(65) Prior Publication Data

US 2019/0348474 A1     Nov. 14, 2019

Related U.S. Application Data

(63) Continuation of application No. PCT/CN2018/096194, filed on Jul. 19, 2018.

(30) Foreign Application Priority Data

May 11, 2018   (CN) ............... 2018 1 0446513

(51) Int. Cl.
*G06F 3/041*     (2006.01)
*H01L 27/32*     (2006.01)
(Continued)

(52) U.S. Cl.
CPC ........ *H01L 27/323* (2013.01); *H01L 51/5012* (2013.01); *H01L 51/5246* (2013.01); *H01L 51/5256* (2013.01); *H01L 51/5281* (2013.01)

(58) Field of Classification Search
CPC ......... G06F 3/0412; G06F 2203/04103; G06F 1/1637; G06F 3/0445; G06F 3/044;
(Continued)

(56) References Cited

U.S. PATENT DOCUMENTS

2009/0251431 A1* 10/2009 Lee ................. G06F 3/0412
345/173
2012/0229021 A1   9/2012 Sakai
(Continued)

FOREIGN PATENT DOCUMENTS

CN   105161514 A   12/2015
CN   105655501 A    6/2016
(Continued)

*Primary Examiner* — Duc Q Dinh

(57) ABSTRACT

An organic light-emitting diode display panel may include a base substrate, an array structure layer, an organic light-emitting layer, a thin film packaging layer, a touch screen layer, and a polarizer layer. The array structure layer, the organic light-emitting layer, and the thin film packaging layer may be sequentially arranged on the base substrate. At least one of the touch screen layer and the polarizer layer may be located in the thin film packaging layer. An inorganic material layer in the thin film packaging layer may be replaced by the touch screen layer and/or the polarizer layer arranged in the thin film packaging layer to reduce a thickness of an OLED display panel.

14 Claims, 4 Drawing Sheets

(51) Int. Cl.
*H01L 51/52* (2006.01)
*H01L 51/50* (2006.01)

(58) Field of Classification Search
CPC .................. G06F 3/041; G06F 3/0416; G06F 2203/04111; G06F 2203/04102; G06F 1/1641; G06F 1/1652; G06F 2203/04112; G06F 3/0443; G06F 3/0488; H01L 27/323; H01L 27/3272; H01L 51/5203; H01L 51/5012; H01L 51/5253; H01L 27/3244; H01L 27/124; H01L 51/5284; H01L 2251/558; H01L 27/1218; H01L 2251/301; H01L 2251/566; H01L 27/1214; H01L 29/6656; H01L 27/0207; H01L 27/1244; G09G 2300/0426; G09G 2380/02
USPC .................................................. 345/173–175
See application file for complete search history.

(56) References Cited

U.S. PATENT DOCUMENTS

| | | | |
|---|---|---|---|
| 2014/0063364 A1* | 3/2014 | Hirakata | G06F 1/1692 |
| | | | 349/12 |
| 2015/0263309 A1 | 9/2015 | Hong | |
| 2016/0364053 A1 | 12/2016 | Lee et al. | |
| 2017/0373270 A1* | 12/2017 | Kim | H01L 27/3262 |

FOREIGN PATENT DOCUMENTS

| | | |
|---|---|---|
| CN | 205609529 U | 9/2016 |
| CN | 106449707 A | 2/2017 |
| CN | 106547405 A | 3/2017 |
| CN | 206179903 U | 5/2017 |
| CN | 107240597 A | 10/2017 |
| CN | 107706216 A | 2/2018 |
| CN | 107863375 A | 3/2018 |

* cited by examiner

ORGANIC LIGHT-EMITTING DIODE DISPLAY PANEL AND ORGANIC LIGHT-EMITTING DIODE DISPLAY APPARATUS

CROSS-REFERENCE TO RELATED APPLICATIONS

The present application is a continuation-application of International (PCT) Patent Application No. PCT/CN2018/096194, filed on Jul. 19, 2018, which claims foreign priority of Chinese Patent Application No. 201810446513.3, filed on May 11, 2018 in the State Intellectual Property Office of China, the entire contents of which are hereby incorporated by reference.

FIELD

The described embodiments relate to a display technology, and more particularly, to an organic light-emitting diode display panel and an organic light-emitting diode display apparatus.

BACKGROUND

Organic light-emitting diode (OLED) display panels have various features such as low power consumption, high color saturation, a wide viewing angle, ultra-thin and foldability, so that the OLED display panels have gradually become a mainstream in display technology. In order to ensure the various features of the OLED display panels, a thin film packaging layer is arranged in the OLED display panel, and includes a plurality of inorganic material layers and a plurality of organic material layers alternately arranged. The plurality of inorganic material layer is configured to prevent moisture and oxygen from permeating. The plurality of organic material layer is configured to reduce pressures on the inorganic material layer, and to prevent the inorganic material layer from being cracked or even broken due to an external force. In a long-term research, Application found and practice that a multilayer structure of the thin film packaging layer increases a number of layers of the OLED display panel, and increases a thickness of the OLED display panel, thereby a length the optical path is increased, and efficiency of luminous flux is reduced.

SUMMARY

The present disclosure provides an OLED display panel and an OLED display apparatus to solve the technical problems that increasing the thickness of the OLED display panel, increasing the length of the optical path, and reducing the luminous flux efficiency, caused by increasing the number of layers of the OLED display panel in the related art.

In order to solve the above-mentioned technical problem, a technical solution adopted by the present disclosure is to provide an organic light-emitting diode display panel including: a base substrate; an array structure layer; an organic light-emitting layer; a thin film packaging layer, wherein the array structure layer, the organic light-emitting layer, and the thin film packaging layer are sequentially arranged on the base substrate; a touch screen layer and a polarizer layer, wherein at least one of the touch screen layer and the polarizer layer is located in the thin film packaging layer; a bonding layer, wherein the bonding layer is configured to fix the touch screen layer or the polarizer layer; the bonding layer is made of an organic material; the bonding layer is an optically clear adhesive layer or an adhesive layer.

In order to solve the above-mentioned technical problem, a technical solution adopted by the present disclosure is to provide an organic light-emitting diode display panel, including: a base substrate; an array structure layer; an organic light-emitting layer; a thin film packaging layer, wherein the array structure layer, the organic light-emitting layer, and the thin film packaging layer are sequentially arranged on the base substrate; a touch screen layer and a polarizer layer, wherein at least one of the touch screen layer and the polarizer layer is located in the thin film packaging layer.

In order to solve the above-mentioned technical problem, a technical solution adopted by the present disclosure is to provide an organic light-emitting diode display apparatus, including an organic light-emitting diode display panel, wherein the organic light-emitting diode display panel includes: a base substrate; an array structure layer; an organic light-emitting layer; a thin film packaging layer, wherein the array structure layer, the organic light-emitting layer, and the thin film packaging layer are sequentially arranged on the base substrate; a touch screen layer and a polarizer layer, wherein at least one of the touch screen layer and the polarizer layer is located in the thin film packaging layer.

Advantages of the disclosure may follow. As compared with the related art, the inorganic material layer in the thin film packaging layer may be replaced by the touch screen layer and/or the polarizer layer arranged in the thin film packaging layer, so that the touch screen layer and the polarizer layer may not only maintain its original function, but also may be configured as the inorganic material layer of the thin film packaging layer to prevent moisture and oxygen from permeating. Thereby the number of layers of the OLED display panel may be reduced, and the thickness of the OLED display panel may be reduced. It may ensure that in cases of normal use function of the OLED display panel, the length the optical path panel may be reduced, and the efficiency of luminous flux may be improved.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

In addition, terms such as "first", "second", and the like are used herein for purposes of description, and are not intended to indicate or imply relative importance or significance or to imply the number of indicated technical features. Thus, the feature defined with "first", "second", and the like may include one or more of such a feature. In the description of the present disclosure, "a plurality of" means two or more, such as two, three, and the like, unless specified otherwise.

Reference throughout this specification, the reference terms "an embodiment", "some embodiments", "one embodiment", "another example", "an example", "a specific example", or "some examples", and the like means that a specific feature, structure, material, or characteristic described in connection with the embodiment or example is included in at least one embodiment or example of the present disclosure. Thus, the illustrative descriptions of the terms throughout this specification are not necessarily referring to the same embodiment or example of the present disclosure. Furthermore, the specific features, structures, materials, or characteristics may be combined in any suitable manner in one or more embodiments or examples. In addition, one skilled in the art may combine the different embodiments or examples described in this specification and features of different embodiments or examples without conflicting with each other.

Figure 1:
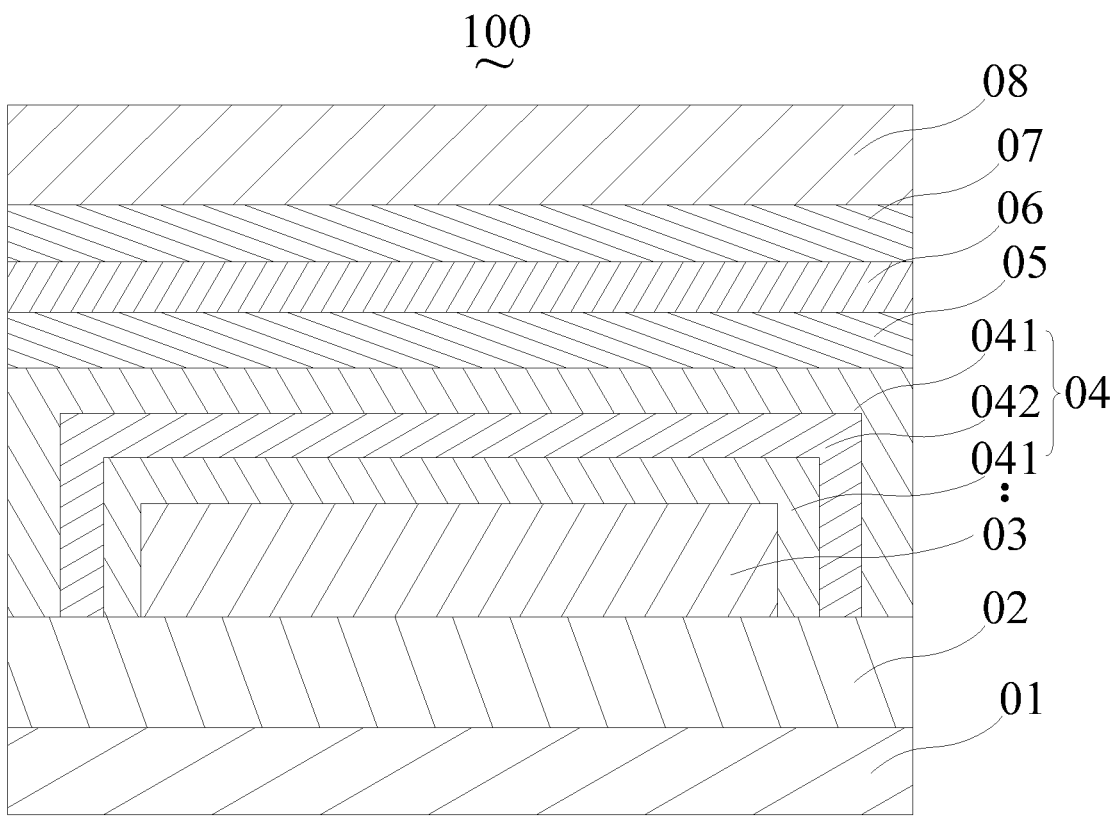
FIG. 1 is a structural illustration of an OLED display panel in the related art.

Referring to FIG. 1, FIG. 1 is a structural illustration of an OLED display panel in the related art. An OLED display panel 100 includes an array structure layer 02, an organic light-emitting layer 03, a thin film packaging layer 04, an optically clear adhesive layer 05, a touch screen layer 06, an bonding layer 07, and a polarizer layer 08 which are sequentially arranged on a base substrate 01.

The thin film packaging layer 04 is a composite structural layer composed of at least three thin film structures. The thin film structure is divided into an organic material layer 042 made of an organic material and an inorganic material layer 041 made of an inorganic material. The inorganic material layer 041 and the organic material layer 042 are alternately arranged. The inorganic material layer 041 is configured to prevent moisture and oxygen from permeating. The organic material layer 042 is configured to reduce stresses on the inorganic material layer 041, and to prevent the inorganic material layer 041 from being cracked or even broken.

The optically clear adhesive layer 05 is configured to bond the touch screen layer 06 to the thin film packaging layer 04. The bonding layer 07 is configured to bond the polarizer layer 08 to the touch screen layer 06. The optically clear adhesive layer 05 and the bonding layer 07 are made of an inorganic material, and the touch screen layer 06 and the polarizer layer 08 are made of an organic material.

In the present disclosure, an OLED display panel 100 may include a base substrate 10, an array structure layer 20, an organic light-emitting layer 30, a thin film packaging layer 40, a touch screen layer 60, and a polarizer layer 80. The array structure layer 20, the organic light-emitting layer 30, and the thin film packaging layer 40 may be sequentially arranged on the base substrate 10. At least one of the touch screen layer 60 and the polarizer layer 80 may be located in the thin film packaging layer 40.

The touch screen layer 60 and the polarizer layer 80 may be made of an inorganic material. The touch screen layer 60 and the polarizer layer 80 may be configured to replace the inorganic material layer 41 in the thin film packaging layer 40. The thickness of the OLED display panel may be reduced. It may ensure that in cases of normal use function of the OLED display panel, the length the optical path panel may be reduced, and the efficiency of luminous flux may be improved. Thereby a number of inorganic material layers 41 in the thin film packaging layer 40 may be reduced to reduce the thickness of the OLED display panel 100, so that the length the optical path panel may be reduced, and the efficiency of luminous flux may be improved.

Figure 2:
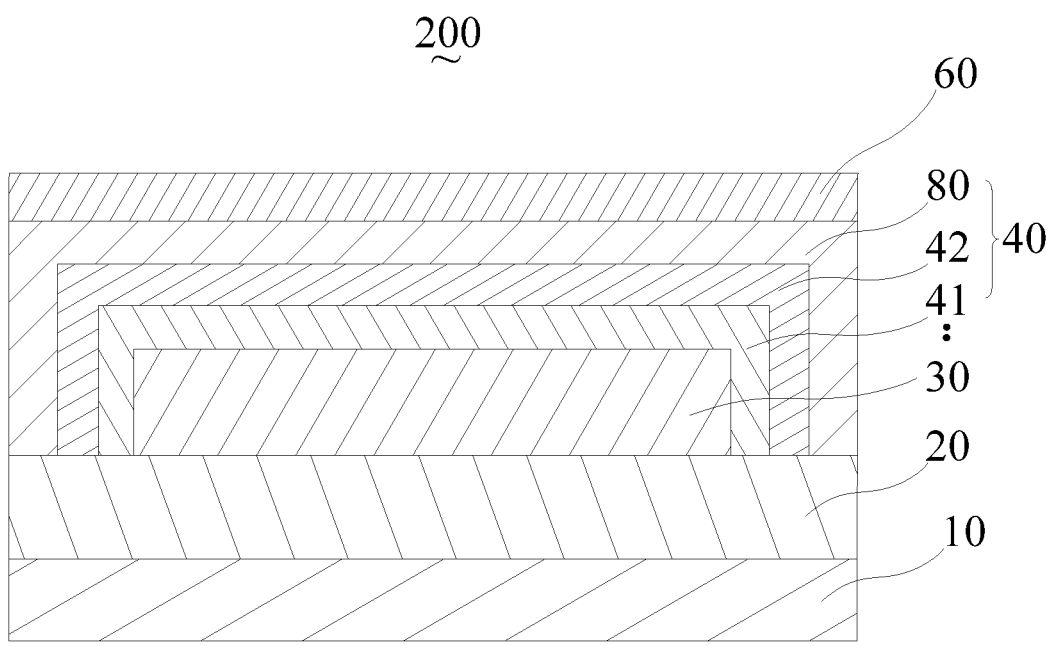
FIG. 2 is a structural illustration of an OLED display panel in accordance with an embodiment in the present disclosure.

Referring to FIG. 2, FIG. 2 is a structural illustration of an OLED display panel in accordance with an embodiment in the present disclosure.

In this embodiment, the thin film packaging layer 40 may include the polarizer layer 80, a plurality of inorganic material layers 41, and a plurality of organic material layers 42. An inorganic layer may be made of an inorganic material, and an organic layer may be made of an organic material. The inorganic layer and the organic layer may be alternately arranged. The inorganic layer may include the polarizer layer 80 and the plurality of inorganic material layers 41. The organic layer may include the plurality of organic material layers 42. The touch screen layer 60 may be arranged on the thin film packaging layer 40. A number of processes may be adapted to connect the touch screen layer 60 and the thin film packaging layer 40, and it is not limited herein.

Because the polarizer layer 80 is made of an inorganic material, the polarizer layer 80 may be arranged in the thin film packaging layer 40 to replace the inorganic material layer 41 arranged in the thin film packaging layer 40, and a number of the organic material layers 42 may not be change. Thereby, the number of inorganic material layers 41 in the thin film packaging layer 40 may be reduced, so that the thickness of the OLED display panel 200 may be reduced.

In another embodiment, the thin film packaging layer 40 may include the touch screen layer 60, a plurality of inorganic material layers 41, and a plurality of organic material layers 42. An inorganic layer may be made of an inorganic material, and an organic layer may be made of an organic material. The inorganic layer and the organic layer may be alternately arranged. The inorganic layer may include the touch screen layer 60 and the plurality of inorganic material layers 41. The organic layer may include the plurality of organic material layers 42. The polarizer layer 80 may be arranged on the thin film packaging layer 40. A number of processes may be adapted to connect the polarizer layer 80 and the thin film packaging layer 40, and it is not limited herein.

Figure 3:
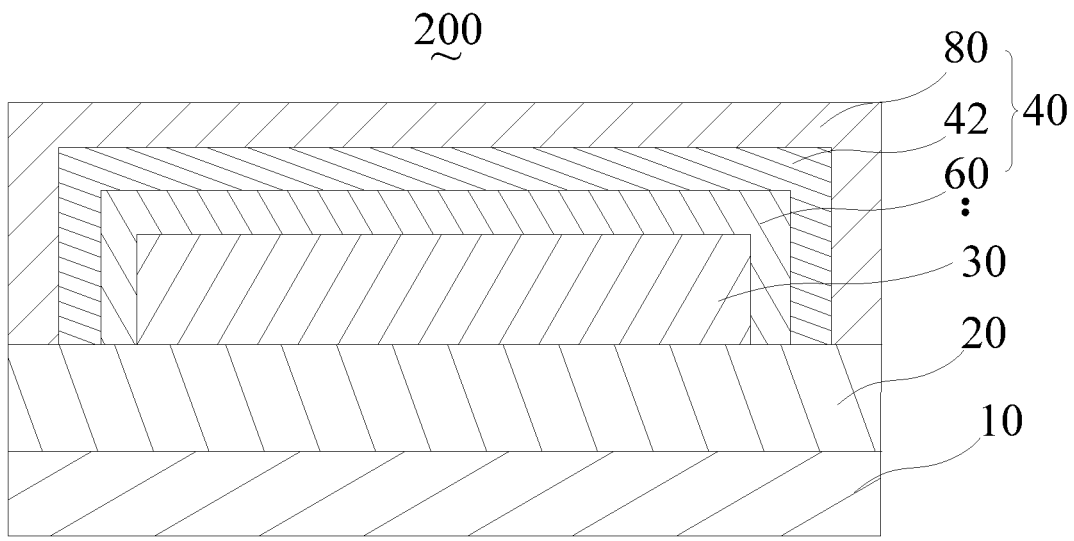
FIG. 3 is a structural illustration of an OLED display panel in accordance with another embodiment in the present disclosure.

Referring to FIG. 3, FIG. 3 is a structural illustration of an OLED display panel in accordance with an embodiment in the present disclosure.

In this embodiment, the thin film packaging layer 40 may include the touch screen layer 60, the polarizer layer 80, a plurality of inorganic material layers 41, and a plurality of organic material layers 42. An inorganic layer may be made of an inorganic material, and an organic layer may be made of an organic material. The inorganic layer and the organic layer may be alternately arranged. The inorganic layer may include the touch screen layer 60, the polarizer layer 80 and the plurality of inorganic material layers 41. The organic layer may include the plurality of organic material layers 42. The touch screen layer 60 may be arranged on a side of the thin film packaging layer 40 adjacent to the organic light-emitting layer 30, and the polarizer layer 80 may be arranged on the other side of the thin film packaging layer 40 away from the organic light-emitting layer 30; or the polarizer layer 80 may be arranged on the side of the thin film packaging layer 40 adjacent to the organic light-emitting layer 30, and the touch screen layer 60 may be arranged on the other side of the thin film packaging layer 40 away from the organic light-emitting layer 30.

Figure 4:
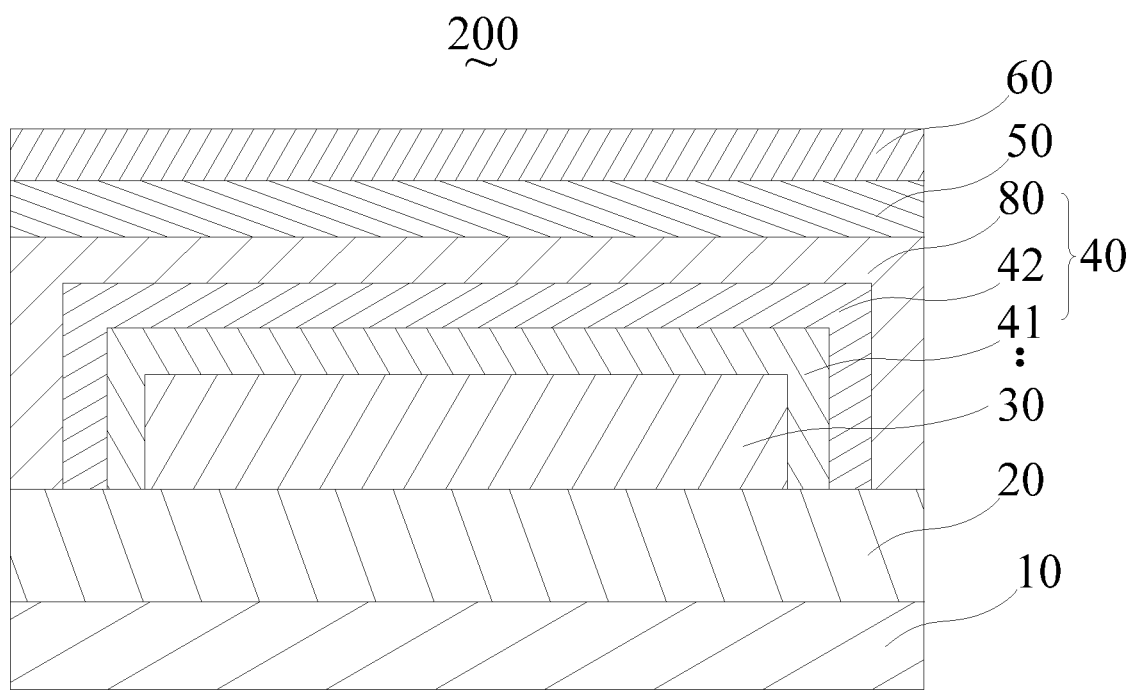
FIG. 4 is a structural illustration of an OLED display panel in accordance with another embodiment in the present disclosure.

Referring to FIG. 4, FIG. 4 is a structural illustration of an OLED display panel in accordance with an embodiment in the present disclosure.

The OLED display panel 200 may further include a bonding layer 50. The bonding layer 50 may be made of an organic material. The bonding layer 50 may be configured to fix the touch screen layer 60 or the polarizer layer 80 on the thin film packaging layer 40.

In this embodiment, the thin film packaging layer 40 may include the polarizer layer 80, a plurality of inorganic material layers 41, and a plurality of organic material layers 42. The polarizer layer 80 may be arranged on a side of the thin film packaging layer 40 away from the organic light-emitting layer 30, or may be arranged on the other side of the thin film packaging layer 40 adjacent to the organic light-emitting layer 30. The touch screen layer 60 may be arranged on the thin film packaging layer 40. The bonding layer 50 may be arranged between the thin film packaging layer 40 and the touch screen layer 60, to fix the touch screen layer 60 on the thin film packaging layer 40.

The bonding layer 50 may be an optically clear adhesive layer or an adhesive layer. The optically clear adhesive layer may be made of a material having a small elastic modulus, such as an acrylic acid material or a methacrylic acid material.

In another embodiment, the thin film packaging layer 40 may include the touch screen layer 60, a plurality of inorganic material layers 41, and a plurality of organic material layers 42. The screen layer 60 may be arranged on a side of the thin film packaging layer 40 away from the organic light-emitting layer 30, or may be arranged on the other side of the thin film packaging layer 40 adjacent to the organic light-emitting layer 30. The polarizer layer 80 may be arranged on the thin film packaging layer 40. The bonding layer 50 may be arranged between the thin film packaging layer 40 and the polarizer layer 80, to fix the polarizer layer 80 on the thin film packaging layer 40.

Figure 5:
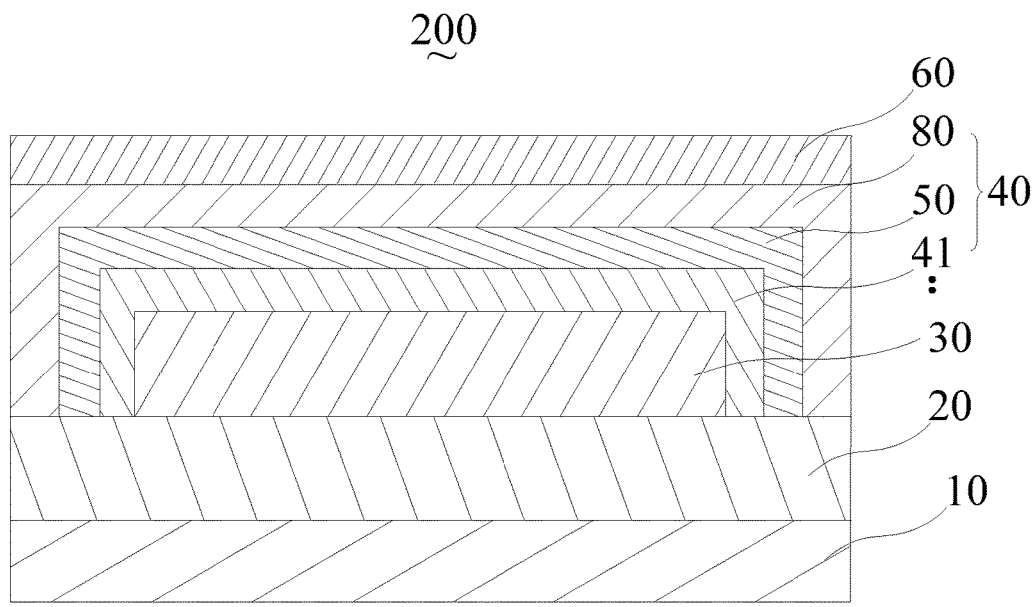
FIG. 5 is a structural illustration of an OLED display panel in accordance with another embodiment in the present disclosure.

Referring to FIG. 5, FIG. 5 is a structural illustration of an OLED display panel in accordance with an embodiment in the present disclosure.

In this embodiment, the thin film packaging layer 40 may include a bonding layer 50. The bonding layer 50 may be made of an organic material. The thin film packaging layer 40 may include the polarizer layer 80, a plurality of inorganic material layers 41, and a plurality of organic material layers 42. An inorganic layer may be made of an inorganic material, and an organic layer may be made of an organic material. The inorganic layer and the organic layer may be alternately arranged. The inorganic layer may include the polarizer layer 80 and the plurality of inorganic material layers 41. The organic layer may include the bonding layer 50 and the plurality of organic material layers 42. The bonding layer 50 may be located on at least one side of the polarizer layer 80. The bonding layer 50 may be configured to bond the polarizer layer 80 and the inorganic material layer 41. The touch screen layer 60 may be arranged on the thin film packaging layer 40. The touch screen layer 60 may be connected to the thin film packaging layer 40. A number of processes may be adapted to connect the touch screen layer 60 and the thin film packaging layer 40, and it is not limited herein.

In this embodiment, the organic material layer 42 in the thin film packaging layer 40 may be replaced by the bonding layer 50. The original inorganic material layer 41 in the thin film packaging layer 40 may be replaced by the polarizer layer 80. Thereby, the number of inorganic material layers 41 and the number of organic material layer 42 in the thin film packaging layer 40 may be reduced, so that the thickness of the OLED display panel 200 may be reduced.

In another embodiment, the thin film packaging layer 40 may include the touch screen layer 60, a plurality of inorganic material layers 41, and a plurality of organic material layers 42. An inorganic layer may be made of an inorganic material, and an organic layer may be made of an organic material. The inorganic layer and the organic layer may be alternately arranged. The inorganic layer may include the touch screen layer 60 and the plurality of inorganic material layers 41. The organic layer may include the bonding layer 50 and the plurality of organic material layers 42. The bonding layer 50 may be located on at least one side of the touch screen layer 60. The bonding layer 50 may be configured to bond the touch screen layer 60 and the inorganic material layer 41. The polarizer layer 80 may be arranged on the thin film packaging layer 40. The polarizer layer 80 may be connected to the thin film packaging layer 40. A number of processes may be adapted to connect the polarizer layer 80 and the thin film packaging layer 40, and it is not limited herein.

Figure 6:
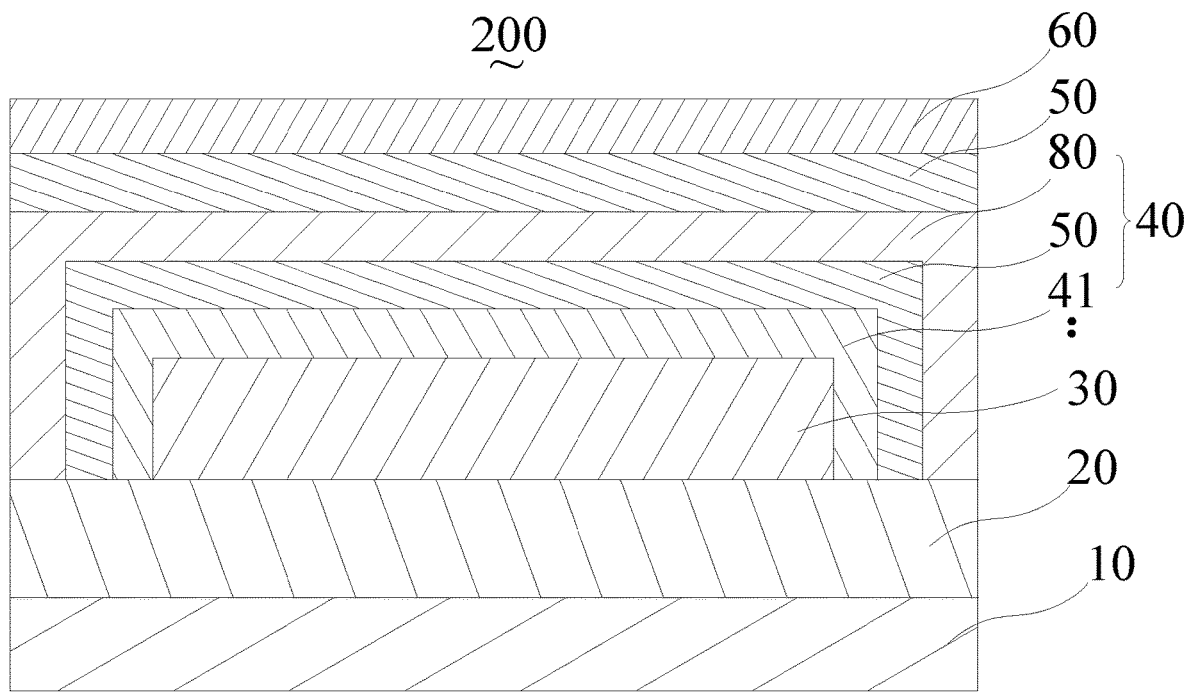
FIG. 6 is a structural illustration of an OLED display panel in accordance with another embodiment in the present disclosure.

Referring to FIG. 6, FIG. 6 is a structural illustration of an OLED display panel in accordance with an embodiment in the present disclosure.

Difference between this embodiment and the previous embodiment is that one of the polarizer layer 80 and the touch screen layer 60 may be arranged in the thin film packaging layer 40, and the other one of the polarizer layer 80 and the touch screen layer 60 may be bonded to the thin film packaging layer 40 by the bonding layer 50.

As shown in FIG. 6, the polarizer layer 80 may be arranged in the thin film packaging layer 40. The touch screen layer 60 may be bonded to the thin film packaging layer 40 by the bonding layer 50.

In another embodiment, as shown in FIG. 6, the touch screen layer 60 may be arranged in the thin film packaging layer 40. The polarizer layer 80 may be bonded to the thin film packaging layer 40 by the bonding layer 50.

Figure 7:
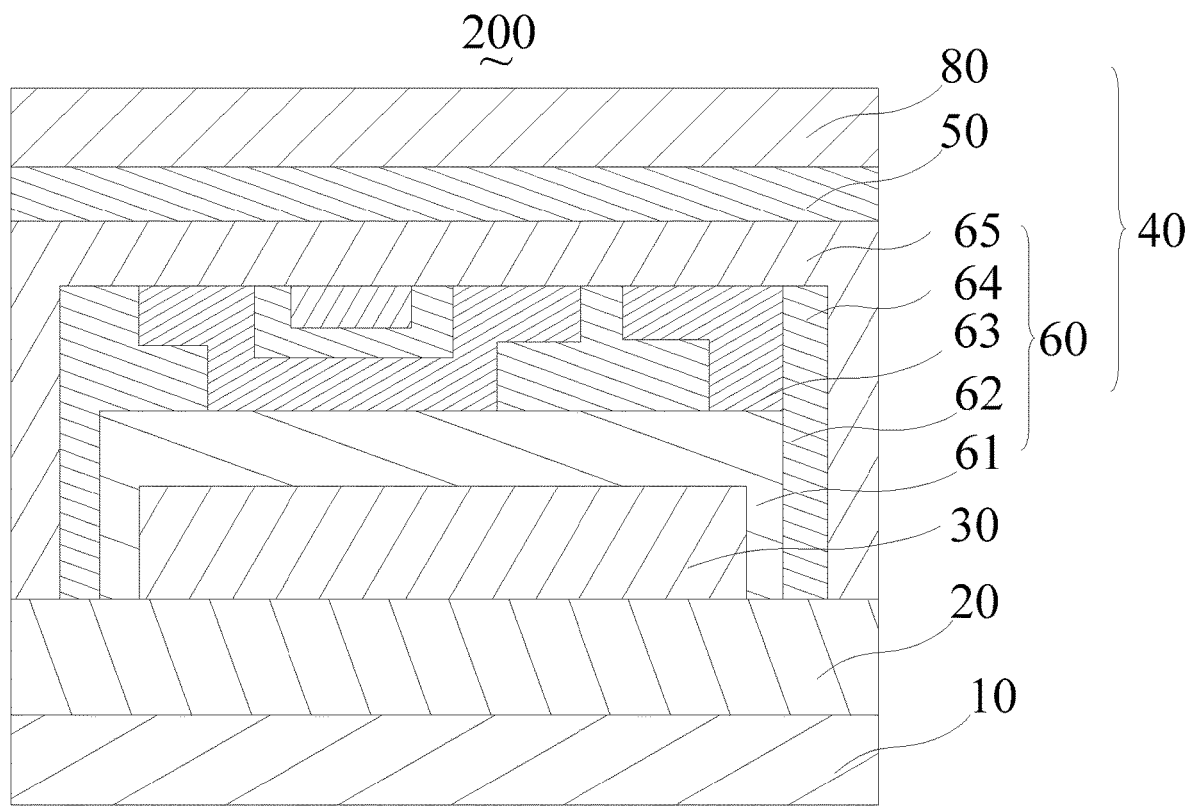
FIG. 7 is a structural illustration of an OLED display panel in accordance with another embodiment in the present disclosure.

Referring to FIG. 7, FIG. 7 is a structural illustration of an OLED display panel in accordance with another embodiment in the present disclosure.

The thin film packaging layer 40 may include the touch screen layer 60, the bonding layer 50, the polarizer layer 80, a plurality of inorganic material layers 41, and a plurality of organic material layers 42. An inorganic layer may be made of an inorganic material, and an organic layer may be made of an organic material. The inorganic layer and the organic layer may be alternately arranged. The inorganic layer may include the touch screen layer 60, the polarizer layer 80, and the plurality of inorganic material layers 41. The organic layer may include the bonding layer 50 and the plurality of organic material layers 42. The bonding layer 50 may be made of an organic material. The bonding layer 50 may be arranged between the touch screen layer 60 and the polarizer layer 80. The touch screen layer 60, the polarizer layer 80, and the bonding layer 50 may be located in the thin film packaging layer 40.

In this embodiment, the touch screen layer 60 may be arranged on a side of the bonding layer 50 adjacent to the organic light-emitting layer 30. The polarizer layer 80 may be arranged on the side of the bonding layer 50 away from the organic light-emitting layer 30.

In another embodiment, the polarizer layer 80 may be arranged on a side of the bonding layer 50 adjacent to the organic light-emitting layer 30. The touch screen layer 60 may be arranged on the side of the bonding layer 50 away from the organic light-emitting layer 30.

The touch screen layer may include a first inorganic insulating layer 61, a second inorganic insulating layer 62, a first metal layer 63, and a second metal layer 65.

As compared with the related art, the inorganic material layer 41 in the thin film packaging layer 40 may be replaced by the touch screen layer 60 and/or the polarizer layer 80 arranged in the thin film packaging layer 40, and the organic material layers 42 in the thin film packaging layer 40 may be replaced by the bonding layer 50 arranged in the thin film packaging layer 40, so that the touch screen layer 60 and the polarizer layer 80 may not only maintain its original function, but also may be configured as the inorganic material layer 41 of the thin film packaging layer 40 to prevent moisture and oxygen from permeating. Thereby the number of layers of the OLED display 200 panel may be reduced, and the thickness of the OLED display panel 200 may be reduced. It may ensure that in cases of normal use function of the OLED display panel 200, the length the optical path panel may be reduced, and the efficiency of luminous flux may be improved.

Figure 8:
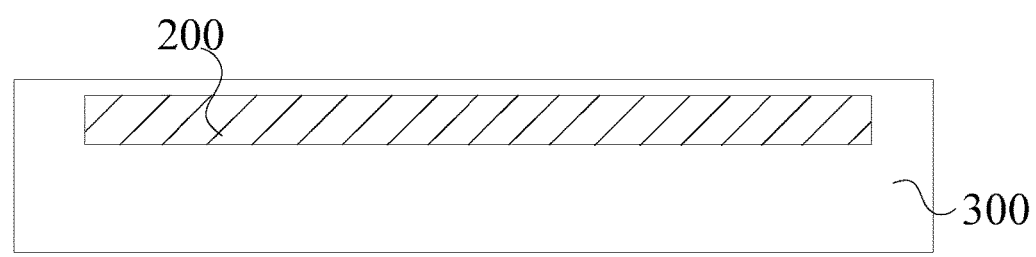
FIG. 8 is a structural illustration of an OLED display apparatus in accordance with an embodiment in the present disclosure.

Referring to FIG. 8, FIG. 8 is a structural illustration of an OLED display apparatus in accordance with an embodiment in the present disclosure. The present disclosure further provides an OLED display apparatus 300. The OLED display apparatus 300 may include the OLED display panel 200 in the above-mentioned embodiments. The structure of the OLED display panel 200 may refer to the above-mentioned descriptions, therefore no additional description is given herein.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. An organic light-emitting diode display panel, comprising:
   a base substrate;
   an array structure layer;
   an organic light-emitting layer;
   a thin film packaging layer, wherein the array structure layer, the organic light-emitting layer, and the thin film packaging layer are sequentially arranged on the base substrate;
   a touch screen layer and a polarizer layer, wherein at least one of the touch screen layer and the polarizer layer is located in the thin film packaging layer;
   wherein the touch screen layer and the polarizer layer are formed of an inorganic material;
   wherein the thin film packaging layer further comprises:
   a plurality of inorganic material layers,
   a plurality of organic material layers,
   an inorganic layer made of an inorganic material, and
   an organic layer made of an organic material;
   wherein
   the inorganic layer and the organic layer are alternately arranged;
   the inorganic layer comprises at least one of the touch screen layer and the polarizer layer, and comprises the plurality of inorganic material layers;
   the organic layer comprises the plurality of organic material layers.

2. The organic light-emitting diode display panel according to claim 1, wherein
   the organic light-emitting diode display panel further comprises a bonding layer;
   the bonding layer is configured to fix the touch screen layer or the polarizer layer; and
   the bonding layer is made of an organic material.

3. The organic light-emitting diode display panel according to claim 2, wherein
   one of the polarizer layer and the touch screen layer is located in the thin film packaging layer; and
   the other one of the polarizer layer and the touch screen layer are bonded by the bonding layer, to be fixed on the thin film packaging layer.

4. The organic light-emitting diode display panel according to claim 1, wherein
   the organic layer further comprises a bonding layer;
   the bonding layer is made of an organic material; the bonding layer is arranged on at least one side of one of the polarizer layer and the touch screen layer, so that the other one of the polarizer layer and the touch screen layer is arranged on the thin film packaging layer by bonding the bonding layer and by the plurality of inorganic material layer.

5. The organic light-emitting diode display panel according to claim 4, wherein
   the other one of the polarizer layer and the touch screen layer are bonded by the bonding layer, to be fixed on the thin film packaging layer.

6. The organic light-emitting diode display panel according to claim 4, wherein
   the thin film packaging layer further comprises a bonding layer;
   the bonding layer is made of an organic material; the bonding layer is arranged between the touch screen layer and the polarizer layer; and
   the touch screen layer, the polarizer layer, and the bonding layer are located in the thin film packaging layer.

7. The organic light-emitting diode display panel according to claim 6, wherein
   the touch screen layer comprises a first inorganic insulating layer, a second inorganic insulating layer, a first metal layer, and a second metal layer sequentially arranged on the organic light-emitting layer.

8. An organic light-emitting diode display apparatus, comprising an organic light-emitting diode display panel, wherein the organic light-emitting diode display panel comprises:
   a base substrate;
   an array structure layer;
   an organic light-emitting layer;
   a thin film packaging layer, wherein the array structure layer, the organic light-emitting layer, and the thin film packaging layer are sequentially arranged on the base substrate;

a touch screen layer and a polarizer layer, wherein at least one of the touch screen layer and the polarizer layer is located in the thin film packaging layer;

wherein the touch screen layer and the polarizer layer are formed of an inorganic material;

wherein the thin film packaging layer further comprises
a plurality of inorganic material layers,
a plurality of organic material layers,
an inorganic layer made of an inorganic material, and
an organic layer made of an organic material;
wherein
the inorganic layer and the organic layer are alternately arranged;
the inorganic layer comprises at least one of the touch screen layer, and the polarizer layer,
and comprises the plurality of inorganic material layers;
the organic layer comprises the plurality of organic material layers.

9. The organic light-emitting diode display apparatus according to claim 8, wherein
the organic light-emitting diode display panel further comprises a bonding layer;
the bonding layer is configured to fix the touch screen layer or the polarizer layer; and
the bonding layer is made of an organic material.

10. The organic light-emitting diode display apparatus according to claim 9, wherein
one of the polarizer layer and the touch screen layer is located in the thin film packaging layer; and
the other one of the polarizer layer and the touch screen layer are bonded by the bonding layer, to be fixed on the thin film packaging layer.

11. The organic light-emitting diode display apparatus according to claim 8, wherein
the organic layer further comprises a bonding layer;
the bonding layer is made of an organic material; the bonding layer is arranged on at least one side of one of the polarizer layer and the touch screen layer, so that the other one of the polarizer layer and the touch screen layer is arranged on the thin film packaging layer by bonding the bonding layer and by the plurality of inorganic material layer.

12. The organic light-emitting diode display apparatus according to claim 11, wherein
the other one of the polarizer layer and the touch screen layer are bonded by the bonding layer, to be fixed on the thin film packaging layer.

13. The organic light-emitting diode display apparatus according to claim 8, wherein
the thin film packaging layer further comprises a bonding layer;
the bonding layer is made of an organic material; the bonding layer is arranged between the touch screen layer and the polarizer layer; and
the touch screen layer, the polarizer layer, and the bonding layer are located in the thin film packaging layer.

14. The organic light-emitting diode display apparatus according to claim 13, wherein
the touch screen layer comprises a first inorganic insulating layer, a second inorganic insulating layer, a first metal layer, and a second metal layer sequentially arranged on the organic light-emitting layer.

* * * * *